(12) United States Patent
Weber

(10) Patent No.: US 9,647,419 B2
(45) Date of Patent: May 9, 2017

(54) ACTIVE SILICON OPTICAL BENCH

(71) Applicant: APPLE INC., Cupertino, CA (US)

(72) Inventor: Raviv Weber, Herzliya (IL)

(73) Assignee: APPLE INC., Cupertino, CA (US)

( * ) Notice: Subject to any disclaimer, the term of this patent is extended or adjusted under 35 U.S.C. 154(b) by 224 days.

(21) Appl. No.: 14/607,089

(22) Filed: Jan. 28, 2015

(65) Prior Publication Data

US 2015/0303649 A1    Oct. 22, 2015

Related U.S. Application Data

(60) Provisional application No. 61/980,055, filed on Apr. 16, 2014.

(51) Int. Cl.
*H01S 5/02* (2006.01)
*H01S 5/022* (2006.01)

(52) U.S. Cl.
CPC .......... *H01S 5/02248* (2013.01); *H01S 5/022* (2013.01); *H01S 5/02236* (2013.01)

(58) Field of Classification Search
CPC ... H01S 5/02248; H01S 5/022; H01S 5/02236
See application file for complete search history.

(56) References Cited

U.S. PATENT DOCUMENTS

| 6,164,826 | A | 12/2000 | Petkovsek |
| 6,184,478 | B1 * | 2/2001 | Imano ............... H05K 1/0253 |
| | | | 174/255 |
| 6,747,292 | B2 | 6/2004 | Kim et al. |
| 7,349,614 | B2 | 3/2008 | Doan |
| 7,496,251 | B2 | 2/2009 | Cohen et al. |
| 8,611,704 | B2 | 12/2013 | Yasuda et al. |
| 2004/0232521 | A1 | 11/2004 | Colombet |
| 2005/0185882 | A1 | 8/2005 | Zack et al. |
| 2011/0049334 | A1 | 3/2011 | Nasu et al. |
| 2012/0153132 | A1 | 6/2012 | Horiguchi et al. |
| 2012/0183253 | A1 * | 7/2012 | Yasuda ............... G02B 6/4214 |
| | | | 385/14 |

FOREIGN PATENT DOCUMENTS

| CN | 102487046 A | 6/2012 |
| CN | 202585521 U | 12/2012 |
| CN | 203855403 U | 10/2014 |
| CN | 204462464 U | 7/2015 |
| WO | 2013186035 A1 | 12/2013 |

OTHER PUBLICATIONS

CN Application # 2015101383195 Office Action dated May 26, 2016.
TW Application # 104107444 Office Action dated Nov. 14, 2016.
CN Application # 201510138319.5 Office Action dated Nov. 30, 2016.

* cited by examiner

*Primary Examiner* — Armando Rodriguez
(74) *Attorney, Agent, or Firm* — D. Kligler IP Services Ltd.

(57) ABSTRACT

An integrated photonic module includes a semiconductor substrate configured to serve as an optical bench. Alternating layers of insulating and conducting materials are deposited on the substrate and patterned so as to define electrical connections. An optoelectronic chip is mounted on the substrate in contact with the electrical connections. A drive chip is mounted on the substrate so as to provide an electrical drive current to the optoelectronic chip via the electrical connections.

16 Claims, 2 Drawing Sheets

ACTIVE SILICON OPTICAL BENCH

CROSS-REFERENCE TO RELATED APPLICATION

This application claims the benefit of U.S. Provisional Patent Application 61/980,055, filed Apr. 16, 2014, which is incorporated herein by reference.

FIELD OF THE INVENTION

The present invention relates generally to optoelectronic components and systems.

BACKGROUND

Integrated photonic modules commonly comprise an optoelectronic chip, such as a laser diode chip, and ancillary micro-optical and/or electronic components. The chip and ancillary components are mounted together on a bare silicon die, which is referred to as a "silicon optical bench" (SiOB). In general, the components are aligned and cemented in place on the SiOB, and the optoelectronic chip is electrically connected to the other electronic components by wire bonding. Alternatively, the optoelectronic and electronic components may be mounted on a suitable printed circuit board and electrically connected by printed circuit traces.

As an example of this sort of construction, U.S. Patent Application Publication 2011/0049334 describes an optical module, which transmits optical signals through a plurality of optical fibers in parallel. The optical module includes a substrate including an electrode pattern, a plurality of optical elements mounted on the electrode pattern of the substrate, and an electronic device mounted on the electrode pattern of the substrate and electrically connected to the optical elements. The optical elements and the electronic device are arranged on the substrate close to each other such that lengths of the transmission lines between the optical elements and the electronic device are minimized.

As another example, U.S. Pat. No. 7,496,251 describes apparatus and methods for packaging optical communication devices include optical bench structures, such as silicon-optical benches (SiOB). The optical bench comprises a substrate having an electrical turning via formed therein. An optoelectronic (OE) chip and integrated circuit (IC) chip are mounted on the optical bench and electrically connected using the electrical turning via. The electrical turning via extends in directions both perpendicular and transverse to a surface of the substrate such that the OE chip and IC chip can be mounted on perpendicular surfaces of the optical bench in close proximity and electrically connected using the electrical turning via.

SUMMARY

Embodiments of the present invention that are described hereinbelow provide novel photonic modules and methods for their production.

There is therefore provided, in accordance with an embodiment of the invention, an integrated photonic module, which includes a semiconductor substrate configured to serve as an optical bench. Alternating layers of insulating and conducting materials are deposited on the substrate and patterned so as to define electrical connections. An optoelectronic chip is mounted on the substrate in contact with the electrical connections. A drive chip is mounted on the substrate so as to provide an electrical drive current to the optoelectronic chip via the electrical connections.

In some embodiments, the alternating layers of the insulating and conducting materials are patterned so as to define a transmission line between the drive chip and the optoelectronic chip, wherein the transmission line has a characteristic impedance that matches an input impedance of the optoelectronic chip. Typically, the characteristic impedance of the transmission line is less than 5Ω. In a disclosed embodiment, the layers of the conducting materials include a first metal layer configured as a ground plane and a second metal layer, separated from the first metal layer by a layer of the insulating material, in which at least one feed line is formed, thereby defining the transmission line. A ratio of a thickness h of the layer of the insulating material to a width W of the at least one feed line is typically less than 1/50.

Additionally or alternatively, the transmission line includes differential transmission line, including a pair of parallel feed lines formed in one of the layers of the conducting material.

Further additionally or alternatively, the module includes a decoupling capacitor, which is mounted on the substrate and interposed in the transmission line between the drive chip and the optoelectronic chip.

In a disclosed embodiment, the optoelectronic chip includes a laser diode, and the module includes at least one optical element mounted on the substrate in alignment with the optoelectronic chip.

There is also provided, in accordance with an embodiment of the invention, a method for producing a photonic module. The method includes providing a semiconductor substrate configured to serve as an optical bench, depositing alternating layers of insulating and conducting materials on the substrate, and patterning the layers so as to define electrical connections. An optoelectronic chip is mounted on the substrate in contact with the electrical connections, and a drive chip is mounted on the substrate so as to provide an electrical drive current to the optoelectronic chip via the electrical connections.

The present invention will be more fully understood from the following detailed description of the embodiments thereof, taken together with the drawings in which:

DETAILED DESCRIPTION OF EMBODIMENTS

Figure 1:
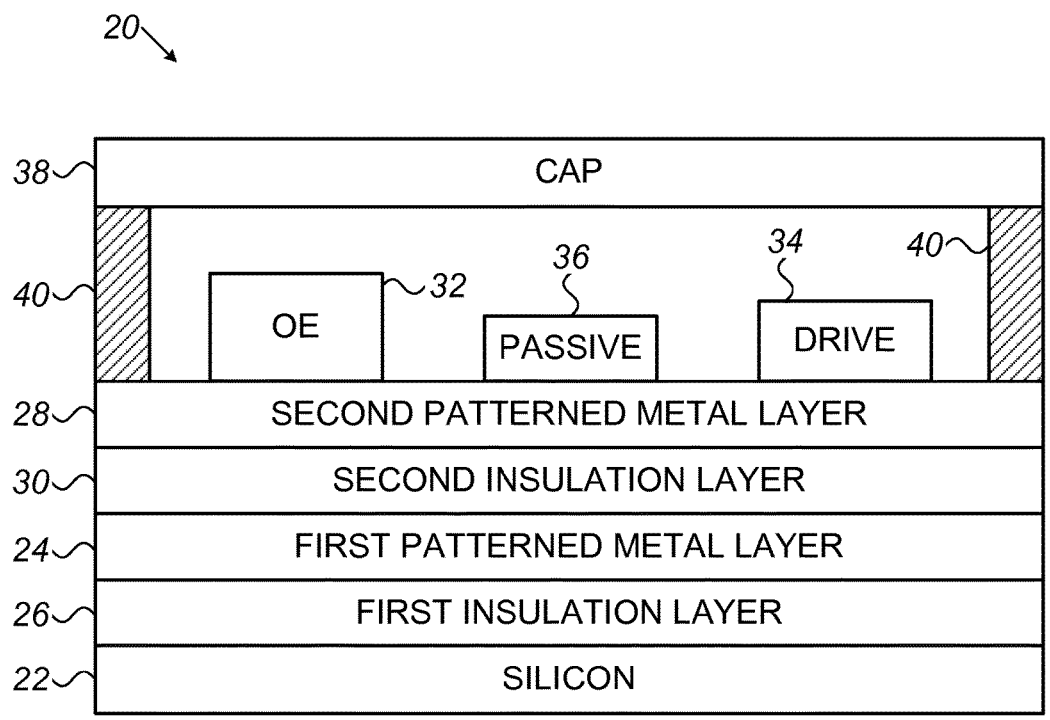
FIG. 1 a schematic, sectional illustration of an integrated photonic module (IPM), in accordance with an embodiment of the present invention.

Laser diodes are generally characterized by very low input impedance (on the order of 1Ω) and commonly operate at high frequency. To drive a laser diode efficiently, it is therefore desirable that the wires or traces connecting the laser to other circuit components have very low inductance and low overall impedance. These requirements place tight constraints on the design of the module containing the laser diode and generally dictate that the circuit components and the laser diode be placed very close together in order to minimize the length (and hence the inductance and overall impedance) of the conductors.

Embodiments of the present invention that are described herein provide an active SiOB that mitigates these limitations. The SiOB is "active" in the sense that it comprises multiple metal conducting layers, which are deposited on the wafer that serves as the SiOB. The metal layers are separated by one or more intervening insulating layers, such as oxide ($SiO_2$) layers, which are likewise deposited on the wafer. The metal and oxide layers may be deposited on the wafer and patterned using standard fabrication techniques.

Such fabrication techniques are capable of creating very thin insulating layers, on the order of 1 μm or less (in contrast to the much thicker insulating layers in laminated and ceramic printed circuit boards). As a result of the very thin insulating layers and the small distances between the conductors in the metal layers that are deposited on the silicon substrate, it is possible to create transmission lines on the SiOB of very low impedance
  typically less than 5Ω, and even 1Ω or less when needed
    thus, matching the input impedance of devices such as a laser diode. The active SiOB thus serves two purposes at once:
    It provides a precise, stable mounting platform for the optical components of an integrated photonic module, such as micromirrors and lenses, along with the laser diode itself; and
    It provides well-matched, low-impedance electrical connections between the electronic components of the module, including the laser diode and the driver circuit.
Although the embodiments described hereinbelow relate mainly to mounting of a laser diode and ancillary components on an SiOB, the principles of the present invention may similarly be applied using other types of semiconductor substrates and other sorts of optoelectronic integrated circuits, including not only transmitters, but also components such as modulators and receivers.

Thus, some embodiments of the present invention provide an integrated photonic module, which comprises a semiconductor substrate configured to serve as an optical bench. Alternating layers of insulating and conducting materials are deposited on the substrate and patterned so as to define electrical connections. An optoelectronic chip, such as a laser diode, is mounted on the substrate in contact with the electrical connections. A drive chip is also mounted on the substrate so as to provide an electrical drive current to the optoelectronic chip via the electrical connections. The alternating layers of the insulating and conducting materials may be advantageously patterned so as to define a transmission line between the drive chip and the optoelectronic chip, with a characteristic impedance that matches the input impedance of the optoelectronic chip.

FIG. 1 a schematic, sectional illustration of an integrated photonic module (IPM) 20, in accordance with an embodiment of the present invention. Beginning from the bottom up, IPM 20 comprises a silicon substrate 22, configured to serve as the SiOB of the IPM. Alternating layers of insulating material 26, 30, such as $SiO_2$, and conductive material 24, 28, such as gold, aluminum or another metal, are deposited on substrate 22. Although FIG. 1 shows only two insulating and two conductive layers, in alternative embodiments (not shown in the figures) larger numbers of layers may be used in order to implement more complex circuit designs.

Layers 24, 26, 28 and 30 are patterned, using photolithography or other techniques that are known in the art of integrated circuits, to define electrical connections, as illustrated in the figures that follow. These connections typically include conductive lines, vias, connection pads, and other structures as required. For example, first patterned metal layer 24 may be configured to serve as a ground plane, while second patterned metal layer 28 contains conductive lines and pads for connecting an optoelectronic (OE) element 32, such as a laser diode chip, to a driver chip 34.

The components of IPM 20 are mounted over upper metal layer 28. These components may comprise, for example, an optoelectronic element 32, such as a laser diode chip, as well as a driver chip 34 and passive components 36. These passive components may include both optical components and discrete electrical components, such as resistors and capacitors. Although the electrical components within IPM are typically interconnected by conductors in metal layers 24 and 28 deposited on the SiOB, wire bonding may be used to create additional electrical connections, particularly between the IPM and external power, sensing and control components. Optical components, such as microlenses and micromirrors, are mounted on the SiOB in precise alignment with the laser diode or other OE elements. Optionally, the laser diode and other optical components may be protected by an additional optical element 38, such as a cover glass cap, which is supported over the SiOB by a patterned spacer 40. Additionally or alternatively, other sorts of optical components, such as lenses, optical patterning elements, and/or optical filters, may be supported over the SiOB in this manner.

Figure 2:
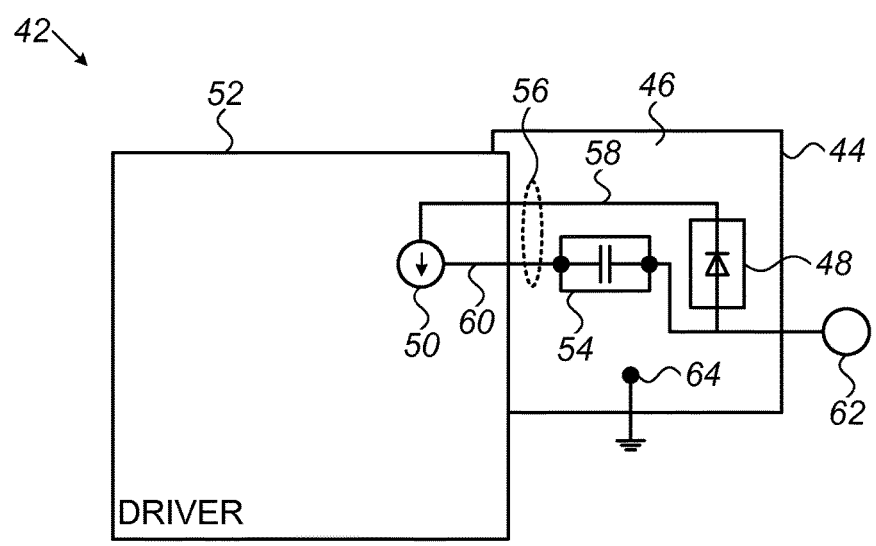
FIG. 2 is a schematic top view of an IPM, in accordance with an embodiment of the present invention.
Figure 3:
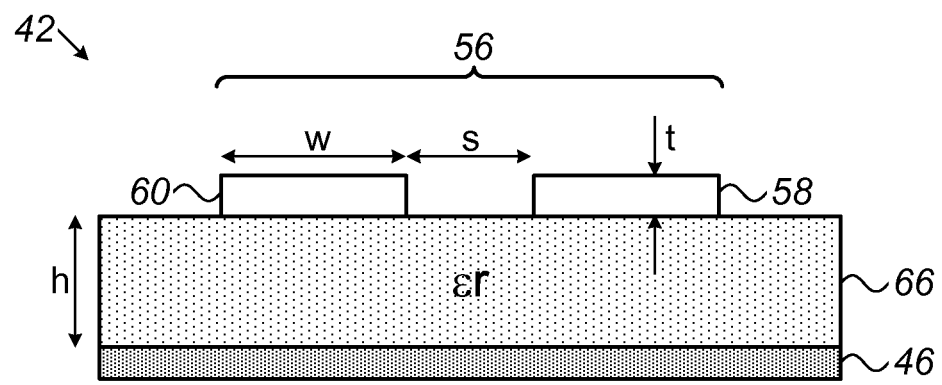
FIG. 3 is a schematic sectional illustration of an IPM, showing parameters and dimensions used in design of a transmission line in the IPM, in accordance with an embodiment of the present invention.
Figure 4:
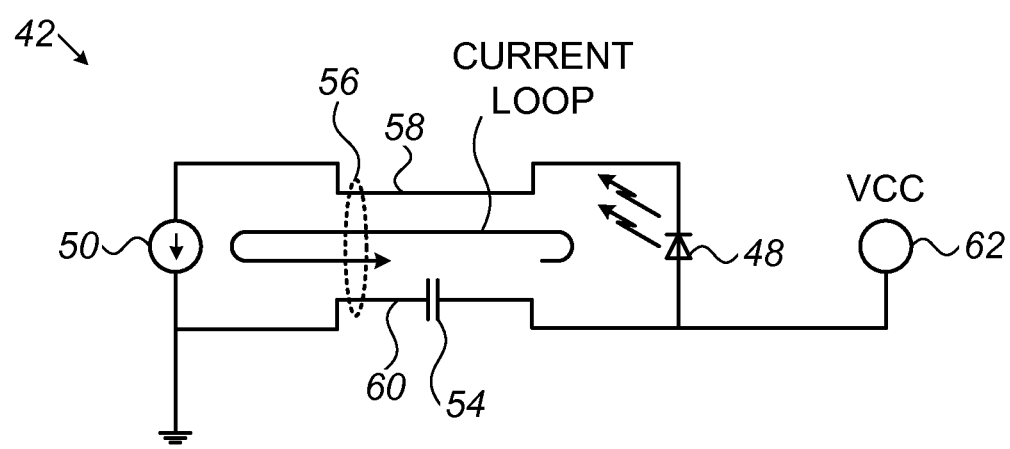
FIG. 4. is an electrical circuit diagram of an IPM, in accordance with an embodiment of the present invention.

Reference is now made to FIGS. 2-4, which schematically illustrate an IPM 42 based on the layer structure of FIG. 1, in accordance with an embodiment of the present invention. FIG. 2 is a top view of IPM 42, while FIG. 3 is a partial sectional view, and FIG. 4 is an electrical circuit diagram.

A laser diode 48 is mounted on an active SiOB 44 in IPM 42. Laser diode 48 is connected to a current source 50 in a driver chip 52 by a low-impedance differential transmission line 56, which defines a current loop, with a decoupling capacitor 54 interposed in the transmission line on the ground (return) side. Transmission line 56 comprises a pair of parallel feed lines 58, 60 in the upper metal layer (corresponding to layer 28 in FIG. 1) on SiOB 44, with a ground plane 46 in the lower metal layer (layer 24 in FIG. 1). The current loop and ground plane are connected respectively to a power supply pin (VCC) 62 and a ground pin 64 of IPM 42.

Although feed lines 58 and 60 are shown in the figure as being relatively far apart, in actual designs the feed lines may be closely spaced in order to minimize inductance. The electrical length of input line 58 between driver 52 and laser 48 is equal to the electrical length of return line 60 through the capacitor.

Proper choice of design parameters of the transmission line, as described further hereinbelow, makes it possible to match the impedance of transmission line 56 to the input impedance of laser diode 48, while still permitting driver chip 52 and laser diode 48 to be placed far apart, typically up to about 8 mm apart (limited by attenuation effects), relative to designs that are known in the art. This feature of the present design leaves more space for decoupling capacitor 54 and affords greater flexibility in placement of optical components of IPM 42 on SiOB 44.

FIG. 3 shows the parameters and dimensions used in determining the characteristic impedance of transmission line 56 in IPM 42. The impedance depends on the effective dielectric constant $\varepsilon_{\textit{eff}}$ of an insulating layer 66 between feed lines 58, 60 and ground plane 46, which in turn depends on the characteristic dielectric constant $\varepsilon_r$ of the insulating material making up layer 66 and the geometry of the feed lines and the insulating layer. Specifically:

$$\varepsilon_{\textit{eff}} = \frac{\varepsilon_r + 1.0}{2} + \frac{\varepsilon_r - 1.0}{2}\left[\frac{1}{\sqrt{1 + \frac{12h}{W}}}\right]$$

wherein h is the thickness of insulating layer 66, and W is the width of feed lines 58, 60, as illustrated in FIG. 3. For $SiO_2$, $\varepsilon_r = 10$.

For a stripline-type transmission line (having only a single feed line over the ground plane), the characteristic impedance is $Z_0$, as given by the following formula (in which t is the thickness of the feed line):

$$Z_0 = \frac{120\pi}{2.0\sqrt{2.0}\,\pi\sqrt{\varepsilon_r + 1.0}}\ln\left\{1.0 + \frac{4.0h}{W'}\left[\frac{4.0h}{W'}\frac{14.0 + \frac{8.0}{\varepsilon_{\textit{eff}}}}{11.00} + \sqrt{\left(\frac{14.0 + \frac{8.0}{\varepsilon_{\textit{eff}}}}{11.0}\right)^2\left(\frac{4.0h}{W'}\right)^2 + \frac{1.0 + \frac{1.0}{\varepsilon_{\textit{eff}}}}{2.0}\pi^2}\right]\right\}$$

In the above formula, $W' = W + \Delta W'$, $$\Delta W' = \Delta W\left(\frac{1.0 + \frac{1.0}{\varepsilon_{\textit{eff}}}}{2.0}\right)$$

and $$\Delta W = \frac{t}{\pi}\ln\left[\frac{4e}{\left(\frac{t}{h}\right)^2 + \left(\frac{1}{\pi}\right)^2\left(\frac{1}{W/t + 1.1}\right)^2}\right]$$

For a differential transmission line, such as transmission line 56 comprising feed lines 58 and 60, the characteristic impedance is given by:

$$Z_{\textit{diff}} = 2Z_0\left[1 - 0.48\exp\left\{-0.96\frac{S}{h}\right\}\right]$$

wherein S is the separation between the two feed lines, as shown in FIG. 3. To achieve low impedance, on the order of a few ohms, with $\varepsilon_r = 10$, the ratio of the thickness h of insulating layer 66 to the width W of feed lines 58 and 60 should be less than about 1/50. To reduce the impedance to about 1Ω, the values should be such that $h/W \cong 1/150$. When h is very small, for example 0.5 μm, as can be produced in the active SiOB design described above, the desired impedance can be achieved with W=75 μm.

Although the figures and description presented above relate, for the sake of concreteness, to a certain specific IPM design, having a certain sequence of layers and layout of components and conductors within those layers, other designs based on the principles of the present invention will be apparent to those skilled in the art and are considered to be within the scope of the present invention. For example, although the figures show an IPM design comprising two insulation layers and two metal layers formed on the silicon substrate, other embodiments may use only a single metal layer (with or without an intervening insulation layer) or three or more layers. Furthermore, such designs are not limited to silicon substrates and may, alternatively, be implemented in modules based on semiconductor substrates of other types.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An integrated photonic module, comprising:
a semiconductor substrate configured to serve as an optical bench;
alternating layers of insulating and conducting materials, which are deposited on the substrate and are patterned so as to define electrical connections;
an optoelectronic chip mounted on the substrate in contact with the electrical connections; and
a drive chip mounted on the substrate so as to provide an electrical drive current to the optoelectronic chip via the electrical connections,
wherein the alternating layers of the insulating and conducting materials are patterned so as to define a transmission line between the drive chip and the optoelectronic chip, wherein the transmission line has a characteristic impedance that matches an input impedance of the optoelectronic chip.

2. The module according to claim 1, wherein the characteristic impedance of the transmission line is less than 5Ω.

3. The module according to claim 1, wherein the layers of the conducting materials comprise a first metal layer configured as a ground plane and a second metal layer, separated from the first metal layer by a layer of the insulating material, in which at least one feed line is formed, thereby defining the transmission line.

4. The module according to claim 3, wherein a ratio of a thickness h of the layer of the insulating material to a width W of the at least one feed line is less than 1/50.

5. The module according to claim 1, wherein the transmission line comprises differential transmission line, comprising a pair of parallel feed lines formed in one of the layers of the conducting material.

6. The module according to claim 1, and comprising a decoupling capacitor, which is mounted on the substrate and interposed in the transmission line between the drive chip and the optoelectronic chip.

7. The module according to claim 1, wherein the optoelectronic chip comprises a laser diode.

8. The module according to claim 1, and comprising at least one optical element mounted on the substrate in alignment with the optoelectronic chip.

9. A method for producing a photonic module, the method comprising:
providing a semiconductor substrate configured to serve as an optical bench;

depositing alternating layers of insulating and conducting materials on the substrate, and patterning the layers so as to define electrical connections;

mounting an optoelectronic chip on the substrate in contact with the electrical connections; and mounting a drive chip on the substrate so as to provide an electrical drive current to the optoelectronic chip via the electrical connections, wherein depositing the alternating layers of the insulating and conducting materials comprises patterning the alternating layers so as to define a transmission line between the drive chip and the optoelectronic chip, wherein the transmission line has a characteristic impedance that matches an input impedance of the optoelectronic chip.

10. The method according to claim 9, wherein the characteristic impedance of the transmission line is less than 5Ω.

11. The method according to claim 9, wherein patterning the alternating layers comprises configuring a first metal layer as a ground plane and forming at least one feed line in a second metal layer, separated from the first metal layer by a layer of the insulating material, so as to define the transmission line.

12. The method according to claim 11, wherein the alternating layers are deposited and patterned such that a ratio of a thickness h of the layer of the insulating material to a width W of the at least one feed line is less than 1/50.

13. The method according to claim 9, wherein patterning the alternating layers comprises forming a differential transmission line comprising a pair of parallel feed lines in one of the layers of the conducting material.

14. The method according to claim 9, and comprising interposing a decoupling capacitor, mounted on the substrate, in the transmission line between the drive chip and the optoelectronic chip.

15. The method according to claim 9, wherein the optoelectronic chip comprises a laser diode.

16. The method according to claim 9, and comprising mounting at least one optical element on the substrate in alignment with the optoelectronic chip.

* * * * *